US010026782B2

(12) United States Patent
Tanaka et al.

(10) Patent No.: US 10,026,782 B2
(45) Date of Patent: Jul. 17, 2018

(54) IMPLEMENTATION OF VMCO AREA SWITCHING CELL TO VBL ARCHITECTURE

(71) Applicant: SANDISK TECHNOLOGIES LLC, Plano, TX (US)

(72) Inventors: Yoichiro Tanaka, Yokkaichi (JP); Yangyin Chen, Heverlee (BE); Chu-Chen Fu, San Ramon, CA (US); Christopher Petti, Mountain View (CA)

(73) Assignee: SANDISK TECHNOLOGIES LLC, Addison, TX (US)

( * ) Notice: Subject to any disclaimer, the term of this patent is extended or adjusted under 35 U.S.C. 154(b) by 12 days.

(21) Appl. No.: 15/633,054

(22) Filed: Jun. 26, 2017

(65) Prior Publication Data

US 2017/0309681 A1 Oct. 26, 2017

Related U.S. Application Data

(63) Continuation of application No. 15/085,813, filed on Mar. 30, 2016, now Pat. No. 9,735,202.

(Continued)

(51) Int. Cl.
| | |
|---|---|
| *H01L 47/00* | (2006.01) |
| *H01L 27/24* | (2006.01) |
| *H01L 45/00* | (2006.01) |
| *G11C 13/00* | (2006.01) |

(52) U.S. Cl.
CPC .......... *H01L 27/249* (2013.01); *G11C 13/004* (2013.01); *G11C 13/0026* (2013.01);
(Continued)

(58) Field of Classification Search
CPC ................ H01L 27/2481; H01L 45/08; H01L 23/53257; H01L 45/124; G11C 13/0007
See application file for complete search history.

(56) References Cited

U.S. PATENT DOCUMENTS

| | | |
|---|---|---|
| 9,450,023 B1 | 9/2016 | Konevecki |
| 2012/0243292 A1 | 9/2012 | Takashima |
| (Continued) | | |

FOREIGN PATENT DOCUMENTS

EP    2887396    6/2015

OTHER PUBLICATIONS

PCT International Search Report and Written Opinion of the International Searching Authority dated Sep. 9, 2015, PCT Patent Application No. PCT/US2015/031804.

(Continued)

*Primary Examiner* — Elias M Ullah
(74) *Attorney, Agent, or Firm* — Vierra Magen Marcus LLP

(57) ABSTRACT

Systems and methods for improving performance of a non-volatile memory that utilizes a Vacancy Modulated Conductive Oxide (VMCO) structure are described. The VMCO structure may include a layer of amorphous silicon (e.g., a Si barrier layer) and a layer titanium oxide (e.g., a TiO2 switching layer). In some cases, the VMCO structure or VMCO stack may use bulk switching or switching O-ion movements across an area of the VMCO structure, as opposed to switching locally in a constriction of vacancy formed filamentary path. A VMCO structure may be partially or fully embedded within a word line layer of a memory array.

18 Claims, 18 Drawing Sheets

Related U.S. Application Data

(60) Provisional application No. 62/296,063, filed on Feb. 16, 2016.

(52) U.S. Cl.
CPC ...... *G11C 13/0038* (2013.01); *G11C 13/0069* (2013.01); *H01L 45/085* (2013.01); *H01L 45/1233* (2013.01); *H01L 45/1246* (2013.01); *H01L 45/146* (2013.01); *H01L 45/1683* (2013.01)

(56) References Cited

U.S. PATENT DOCUMENTS

| | | |
|---|---|---|
| 2013/0292630 A1 | 11/2013 | Sasago |
| 2013/0336037 A1 | 12/2013 | Chen |
| 2014/0332748 A1 | 11/2014 | Khoueir |
| 2015/0069314 A1 | 3/2015 | Arayashiki |
| 2015/0069318 A1* | 3/2015 | Arayashiki ........... H01L 45/085 257/4 |
| 2016/0019952 A1 | 1/2016 | Ratnam |

OTHER PUBLICATIONS

Office Action dated Oct. 3, 2016, U.S. Appl. No. 15/085,813.
Response to Office Action dated Nov. 3, 2016, U.S. Appl. No. 15/085,813.
Office Action dated Dec. 20, 2016, U.S. Appl. No. 15/085,813.
Notice of Allowance dated Jun. 20, 2017, U.S. Appl. No. 15/085,813.
PCT International Search Report dated May 10, 2017, PCT Patent Application PCT/US2017/017235.
PCT Written Opinion of the International Searching Authority dated May 10, 2017, PCT Patent Application PCT/US2017/017235.
Govoreanu, et al., "Vacancy-modulated conductive oxide resistive RAM (VMCO-RRAM): An Area-Scalable Switching Current, Self-Compliant, Highly Nonlinear and Wide On/Off-Window Resistive Switching Cell," 2013 IEEE International Electron Devices Meeting, Dec. 9-11, 2013, Washington, DC.
Office Action dated Oct. 5, 2017, U.S. Appl. No. 15/432,544.
Response to Office Action dated Dec. 22, 2017, U.S. Appl. No. 15/432,544.

* cited by examiner

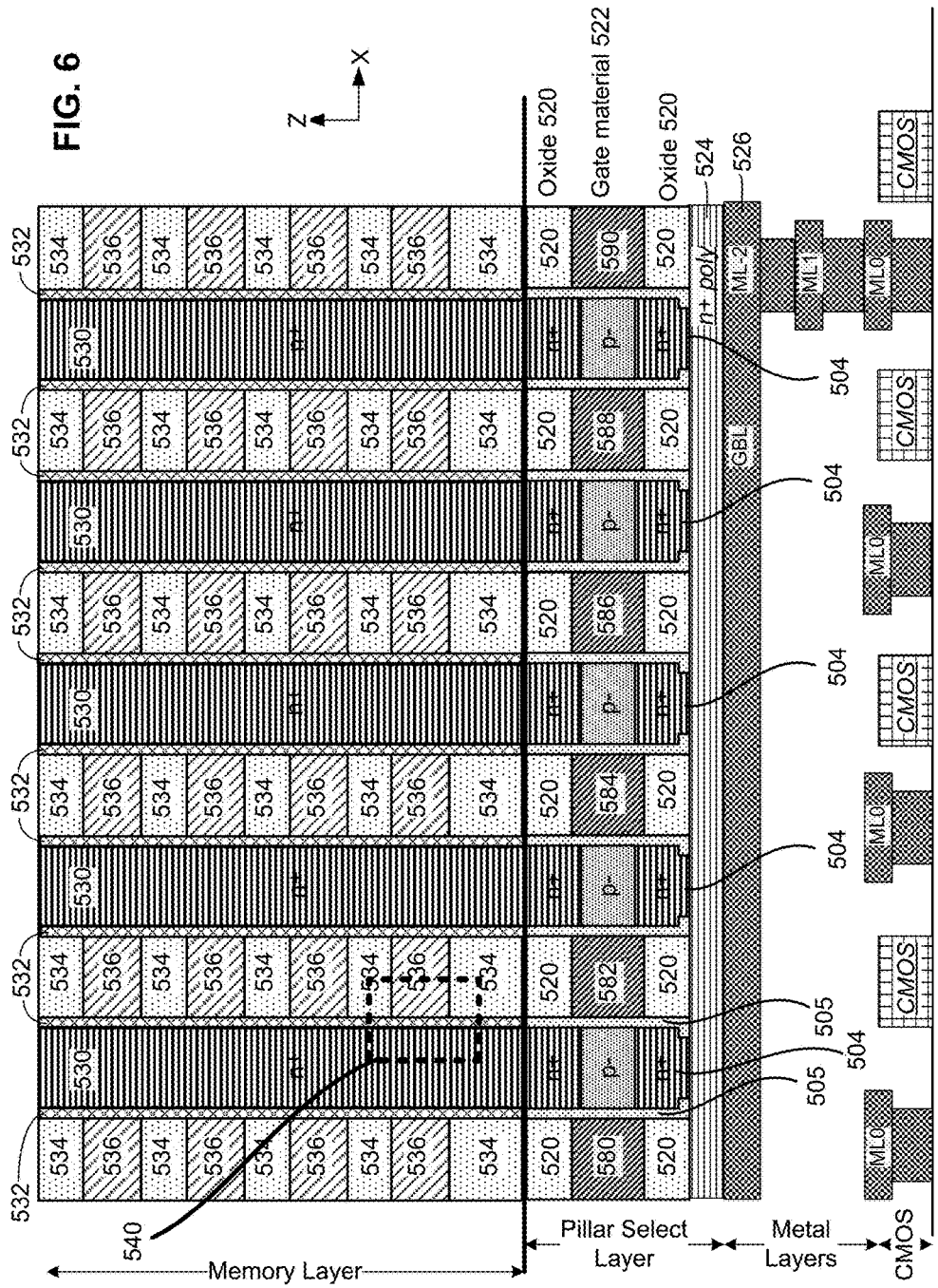

IMPLEMENTATION OF VMCO AREA SWITCHING CELL TO VBL ARCHITECTURE

CLAIM OF PRIORITY

The present application is a continuation application of U.S. patent application Ser. No. 15/085,813, entitled "Implementation of VMCO Area Switching Cell to VBL Architecture," filed Mar. 30, 2016, which claims priority to U.S. Provisional Application No. 62/296,063, entitled "Implementation of VMCO Area Switching Cell to VBL Architecture," filed Feb. 16, 2016, all of which are incorporated herein by reference in their entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations and increased leakage currents through unselected memory cells.

BRIEF DESCRIPTION OF THE DRAWINGS

FIG. 6 depicts a cross-sectional view of a memory structure with vertical bit lines.

DETAILED DESCRIPTION

Figure 1A:
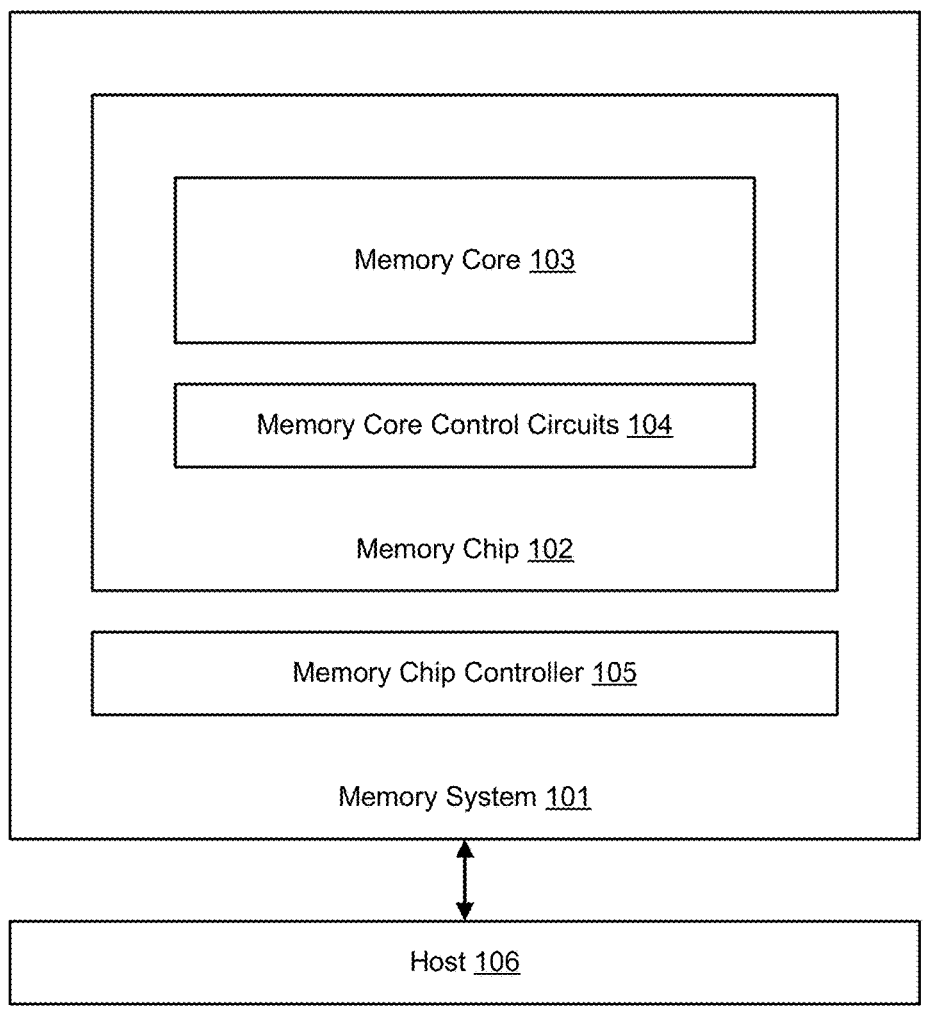
FIGS. 1A-1G depict various embodiments of a memory system.

Technology is described for improving performance of a non-volatile memory that utilizes a Vacancy Modulated Conductive Oxide (VMCO) structure. The VMCO structure may include a layer of amorphous silicon (e.g., a Si barrier layer) and a layer titanium oxide (e.g., a TiO2 switching layer). In some cases, the VMCO structure (or VMCO stack) may use bulk switching or switching O-ion movements across an area of the VMCO structure, as compared with switching locally in a constriction of vacancy formed filamentary path. In some embodiments, VMCO structures may be partially or fully embedded within word line layers of a memory array, such as a memory array arranged using a VBL architecture (e.g., a memory array architecture in which memory cells are arranged between horizontal word lines and vertical bit lines that are orthogonal to a substrate). A VMCO structure may be partially or fully formed within a word line layer of a memory array. A VMCO stack may comprise a layer of amorphous silicon and a layer titanium oxide. In some cases, the VMCO stack may comprise a layer of thin aluminum oxide or other metal oxides arranged between the layer of amorphous silicon and the layer titanium oxide.

One issue with integrating a VMCO stack or a VMCO structure within a memory array is that the thickness of the VMCO layers required for reliable memory cell switching may limit the ability to scale or shrink the memory array (e.g., the layer of amorphous silicon may have to be at least 10 nm and/or the layer of titanium oxide may have to be at least 10 nm). Partially or fully embedding a VMCO structure (or other memory cell switching structure, such as a ReRAM material structure or a phase change material structure) into a recessed portion of a word line layer may allow for a reduction in die area and may improve the reliability of the memory cell structures (by providing improved isolation between VMCO structures). In some embodiments, other memory materials besides amorphous silicon and titanium oxide may also be used. For example, the layer of amorphous silicon may be replaced with a layer of hafnium oxide or other high-k dielectrics that are characterized by a high barrier height and the layer of titanium oxide may be replaced with a layer of tungsten oxide, tantalum oxide, or other lower barrier height dielectrics. In some cases, a layer of thin aluminum oxide and other high-k dielectrics may be arranged between the layer of amorphous silicon and the layer of titanium oxide.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
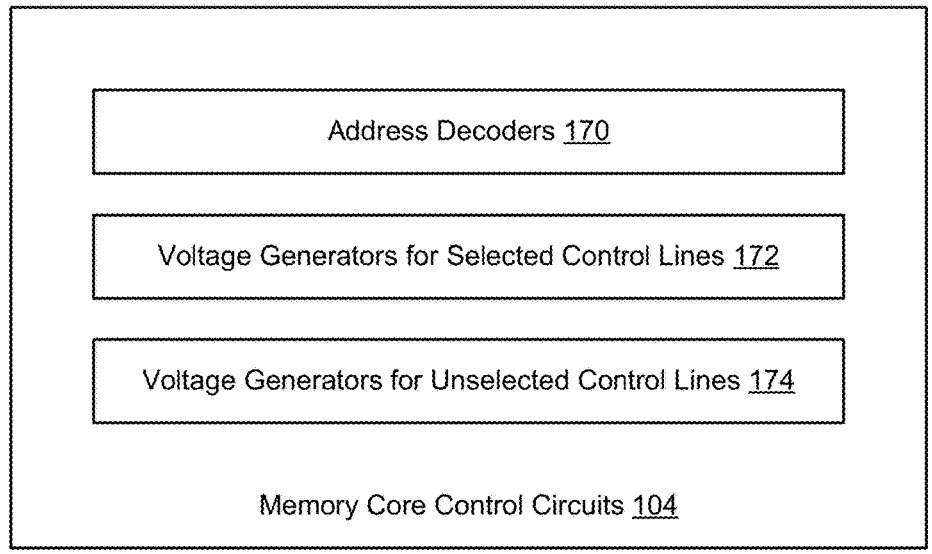

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
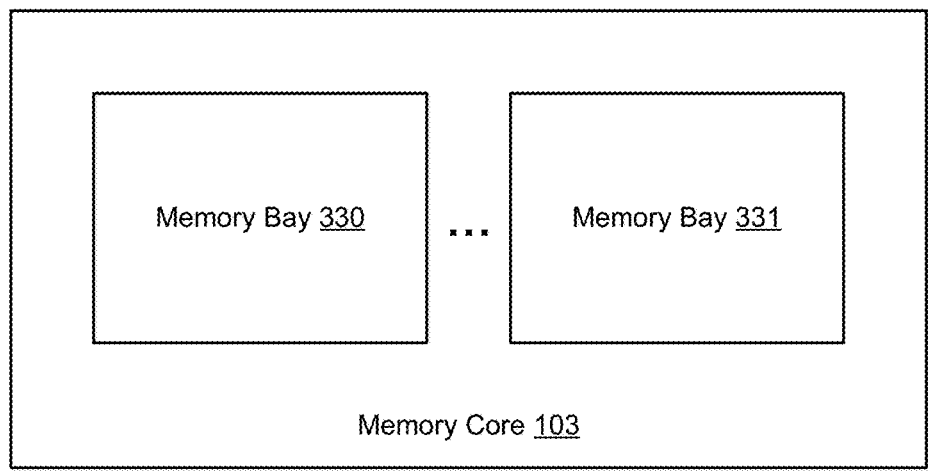

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
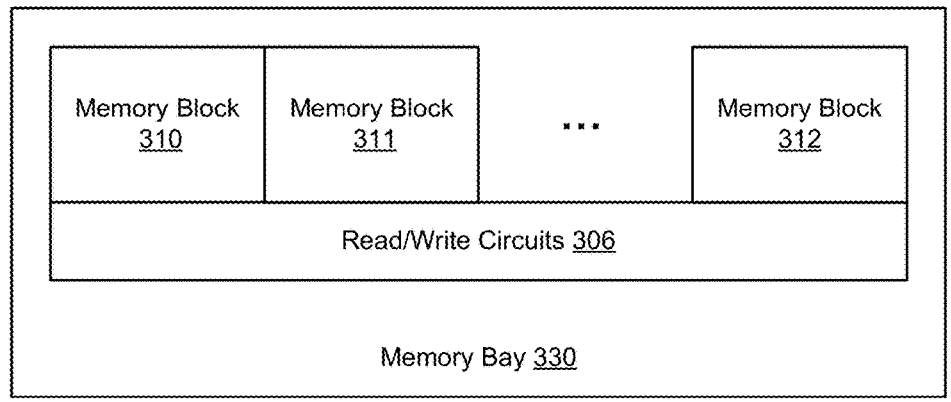

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/ resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
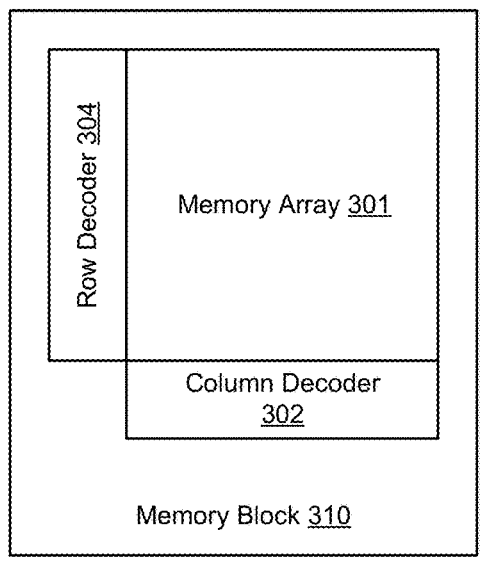

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
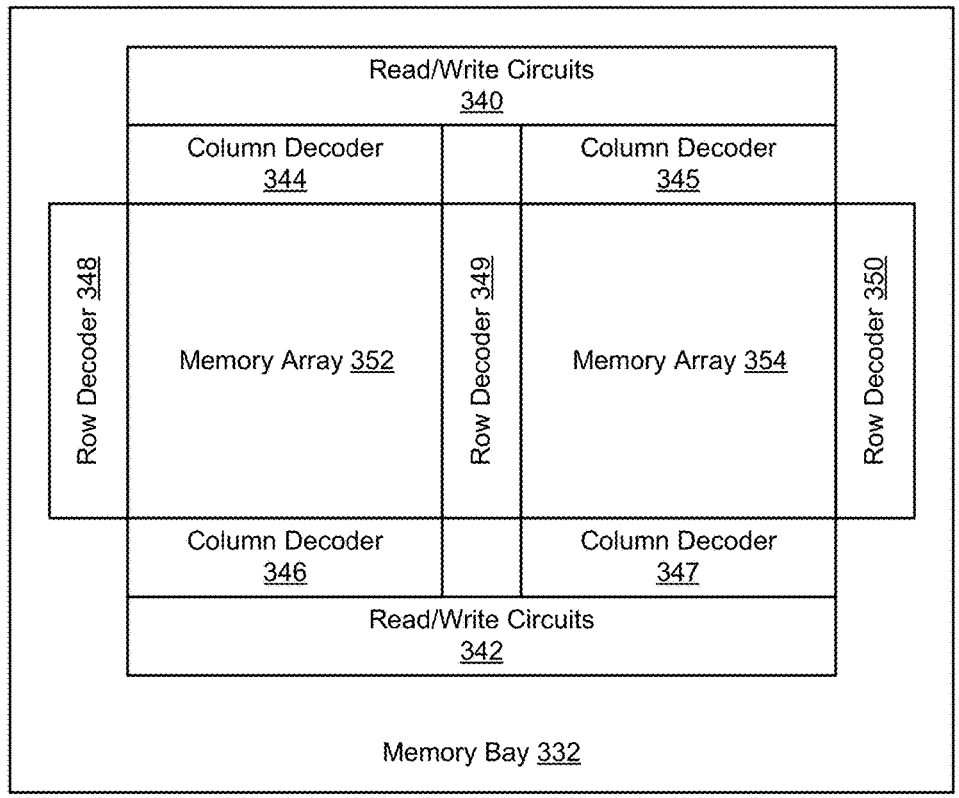

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 1G:
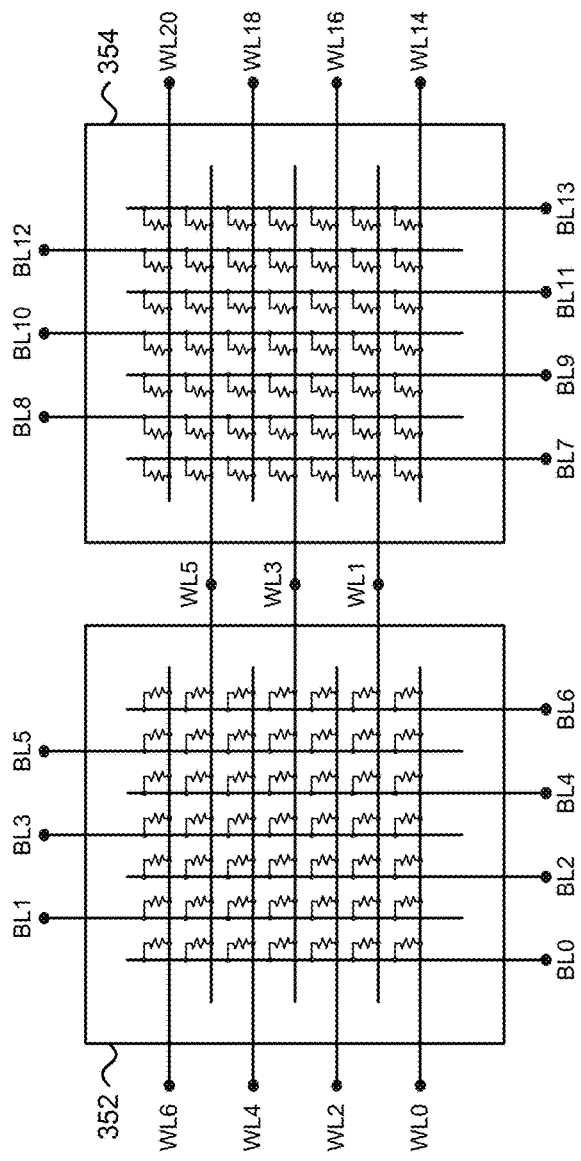

FIG. 1G depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2A:
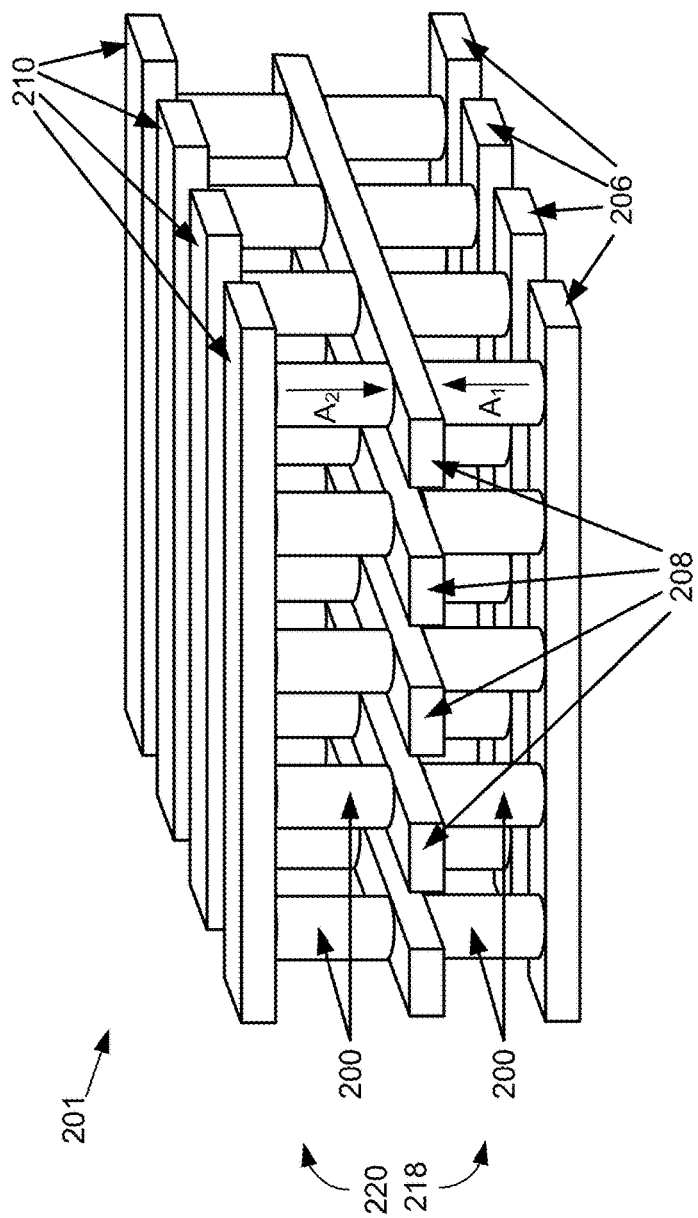
FIGS. 2A-2B depict various embodiments of a portion of a three-dimensional memory array.

FIG. 2A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
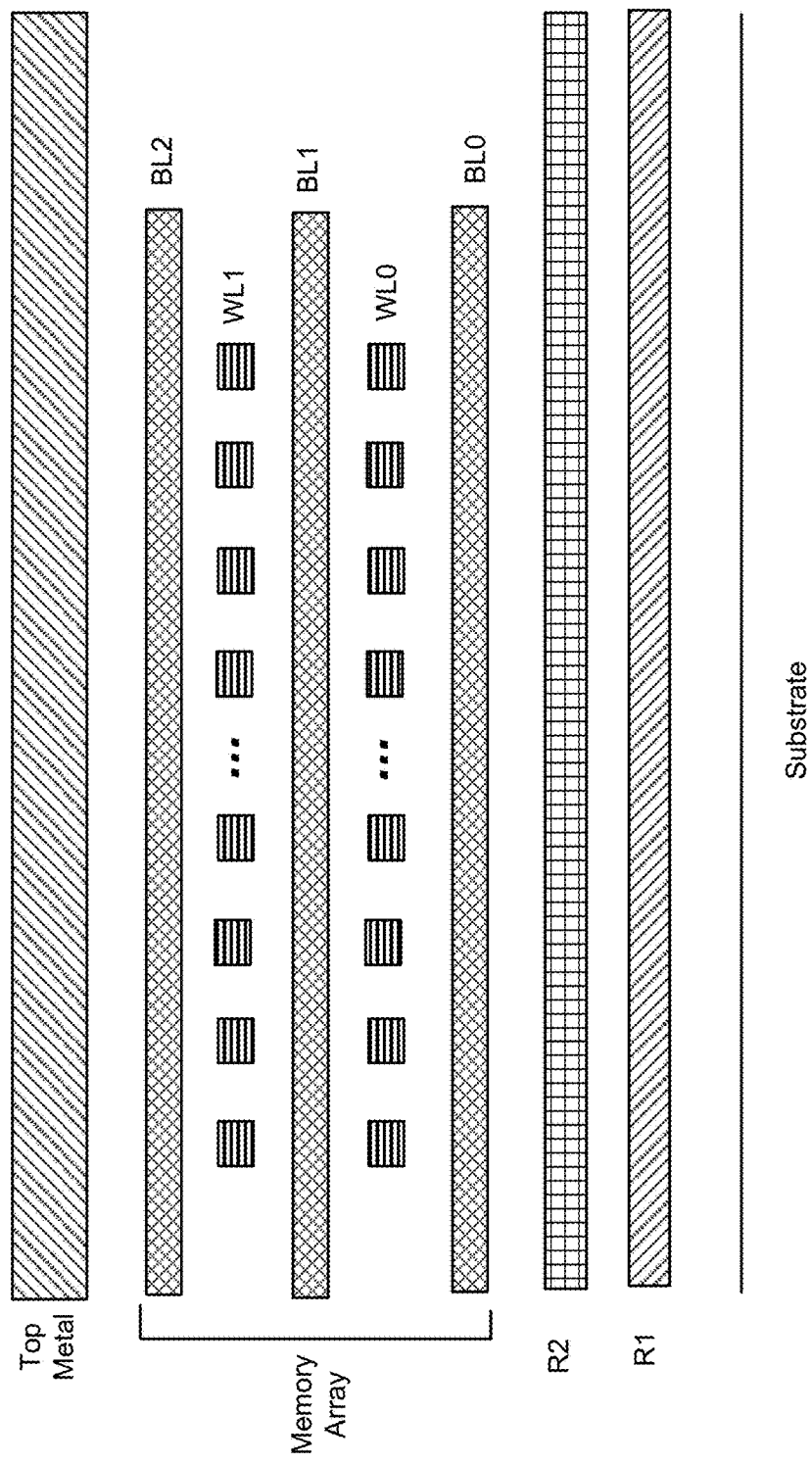

FIG. 2B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3A:
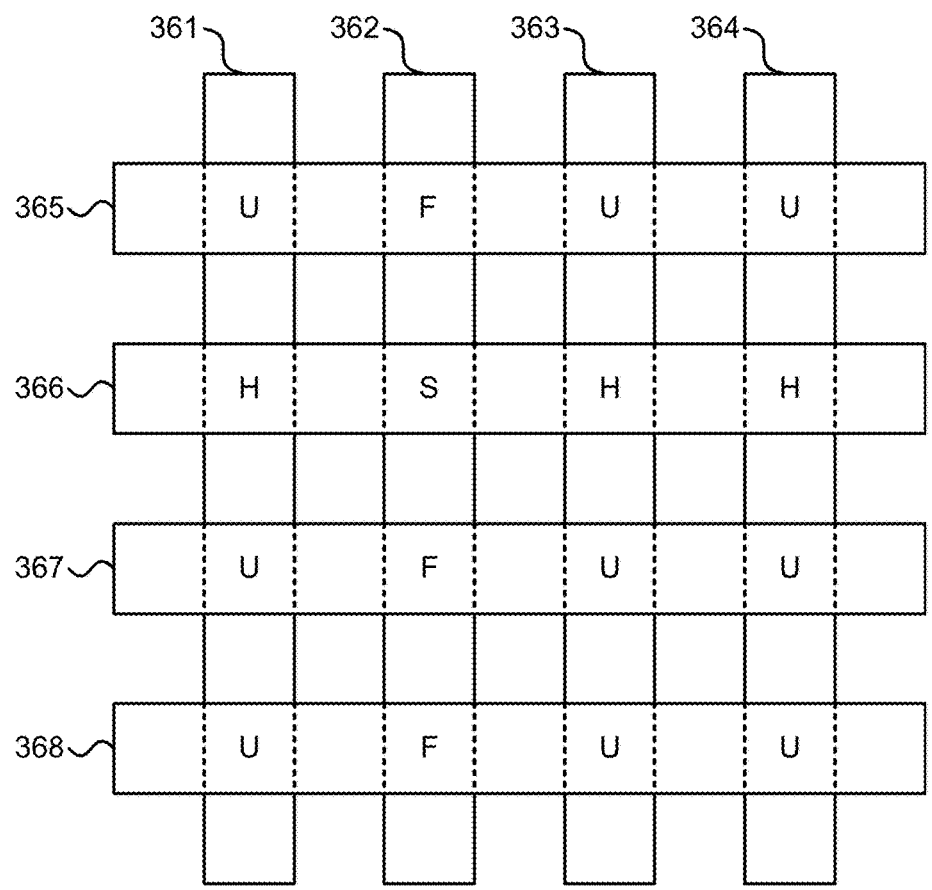
FIGS. 3A-3B depict embodiments of a cross-point memory array.

FIG. 3A depicts one embodiment of a cross-point memory array 360. In one example, the cross-point memory array 360 may correspond with memory array 201 in FIG. 2A. As depicted, cross-point memory array 360 includes word lines 365-368 and bit lines 361-364. The bit lines 361 may comprise vertical bit lines or horizontal bit lines. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3B:
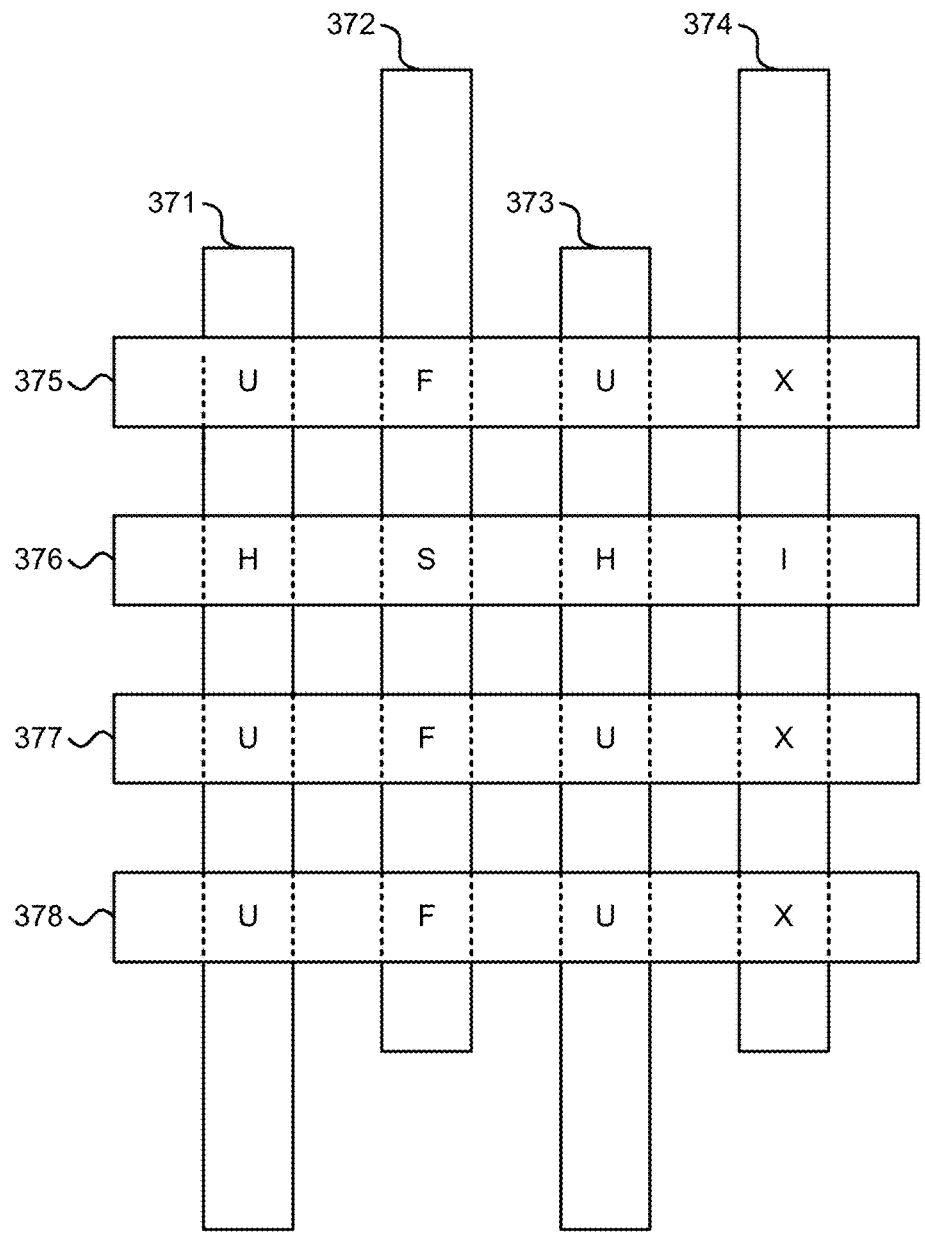

FIG. 3B depicts an alternative embodiment of a cross-point memory array 370. In one example, the cross-point memory array 370 may correspond with memory array 201 in FIG. 2A. As depicted, cross-point memory array 370 includes word lines 375-378 and bit lines 371-374. The bit lines 361 may comprise vertical bit lines or horizontal bit lines. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines.

Figure 4A:
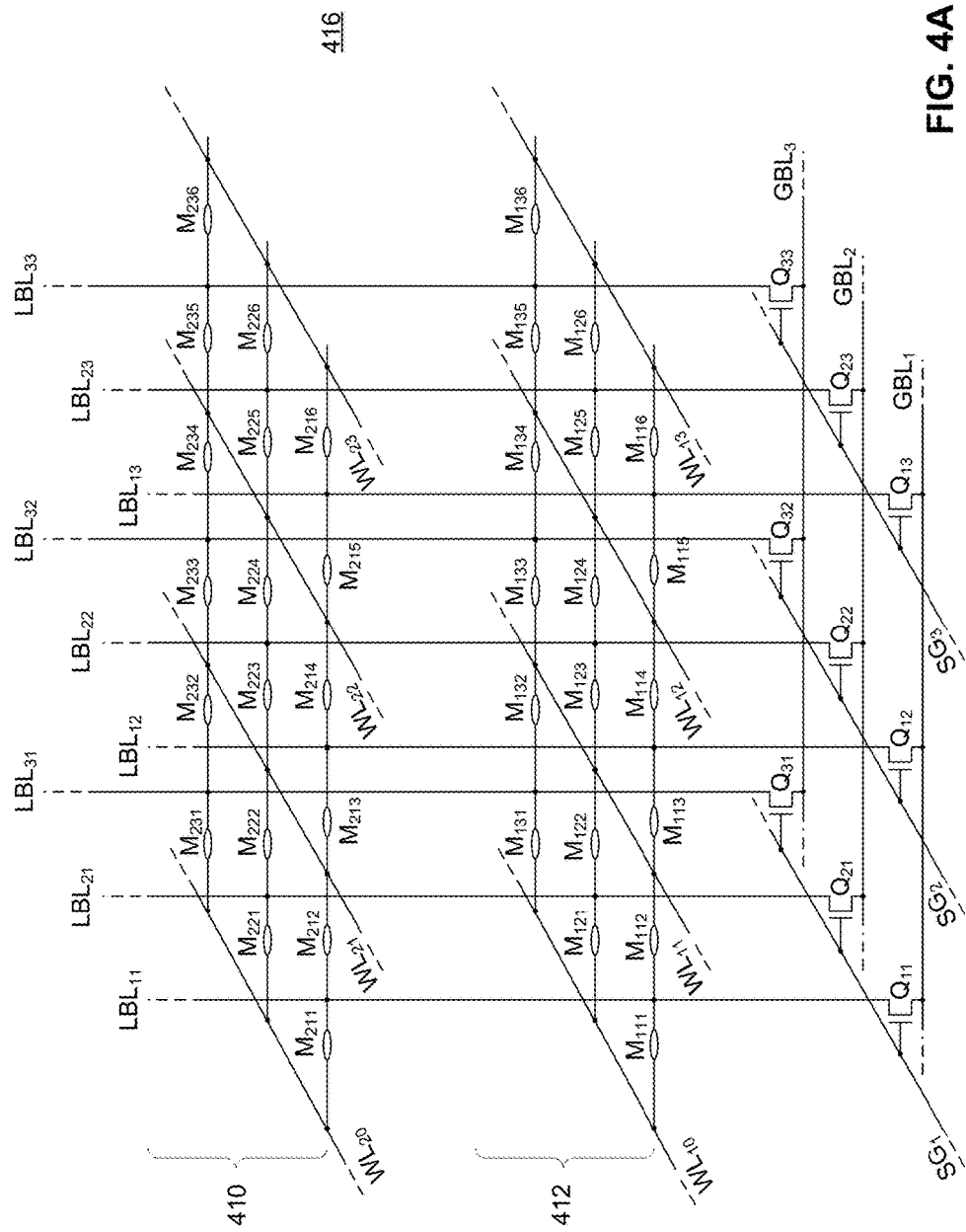
FIGS. 4A-4B depict various embodiments of a portion of a three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
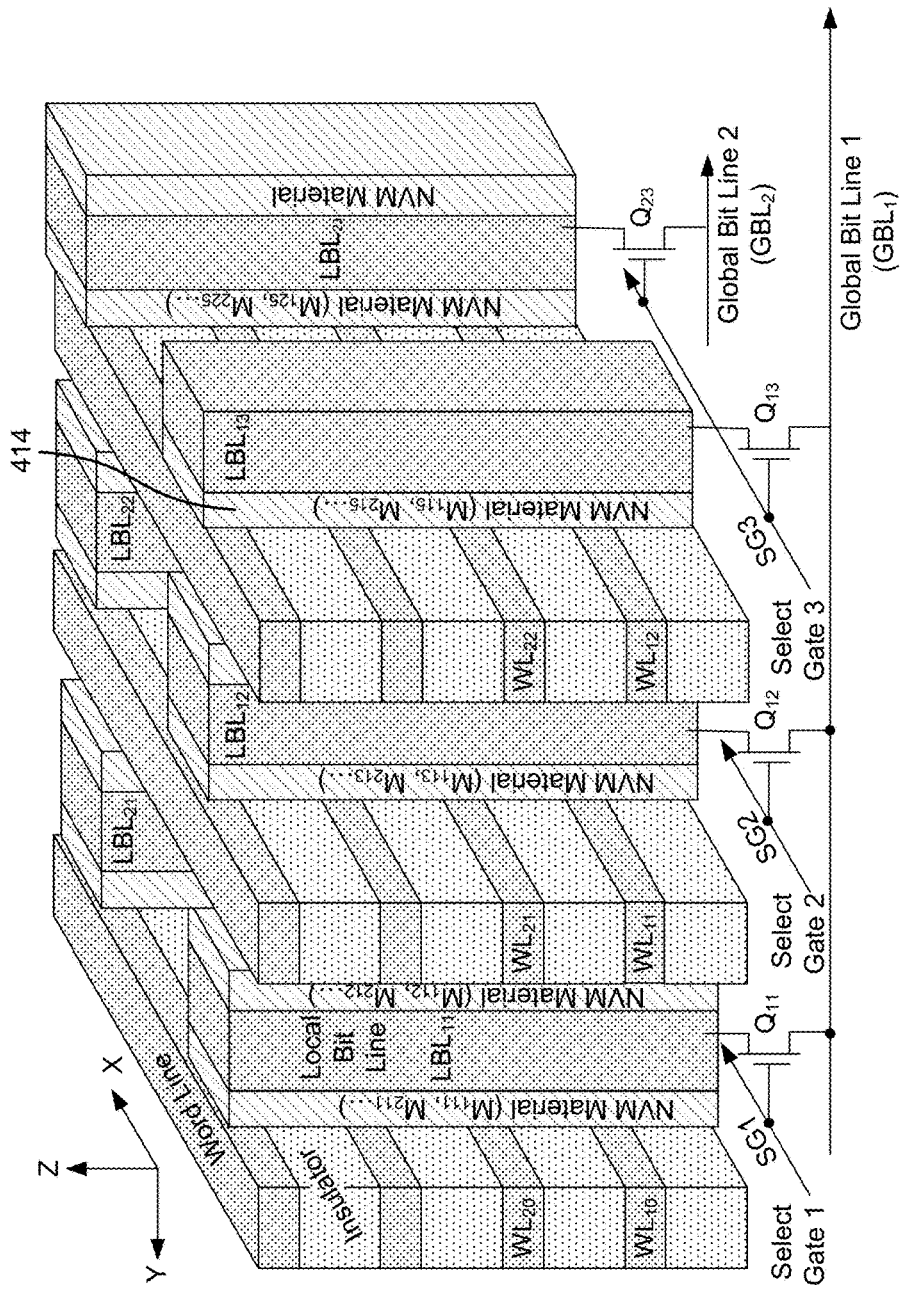

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
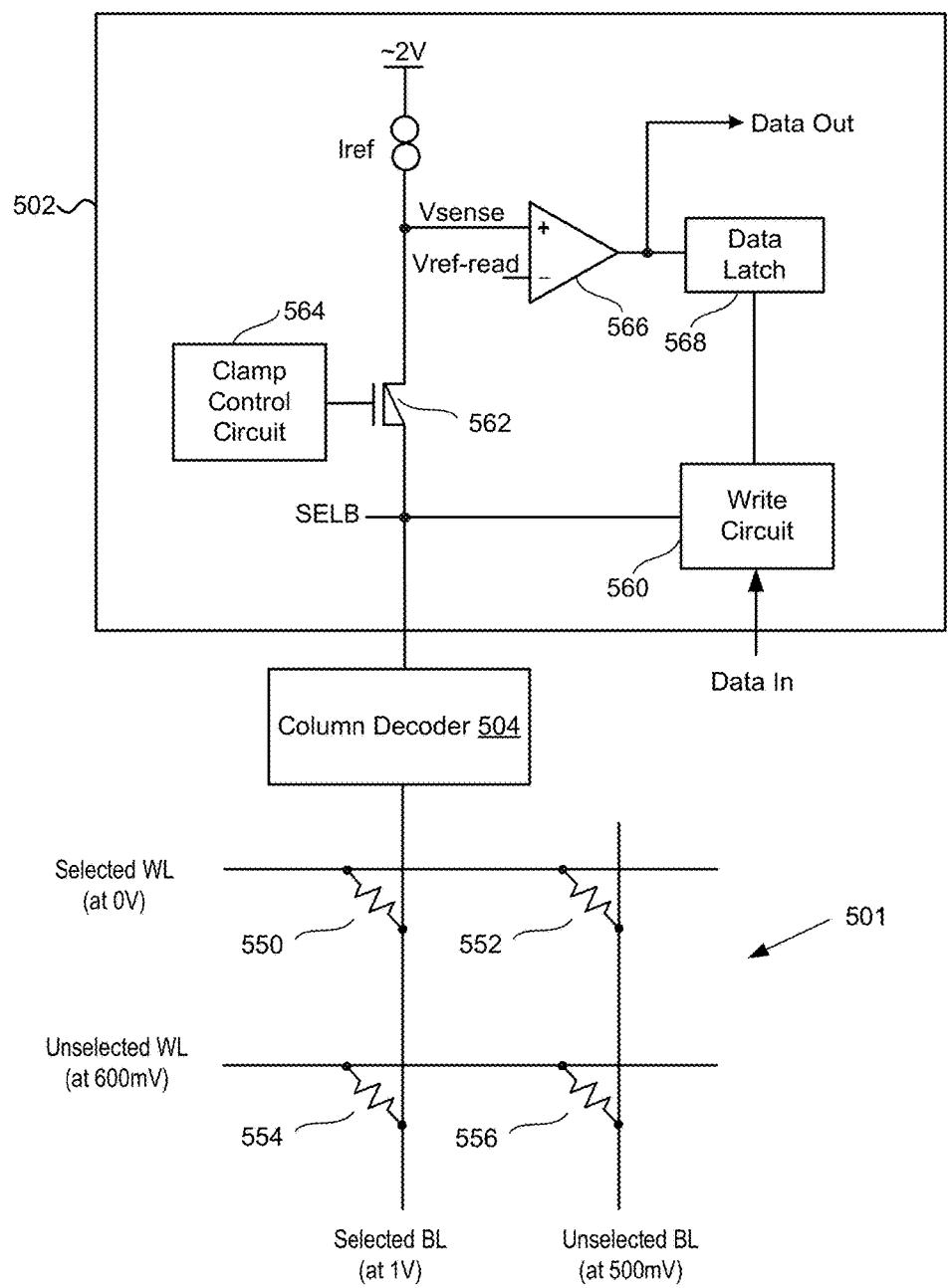
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

FIG. 6 depicts a cross-sectional view of a memory structure using the vertically oriented select devices shown in FIG. 4B. The memory structure of FIG. 6 may comprise a continuous mesh array of memory elements because there are memory elements connected to both sides of the bit lines and memory elements connected to both sides of the word lines. At the bottom of FIG. 6, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ poly-silicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 4B), which are labeled in FIG. 6 as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. In another embodiment, the reversible resistance switching material 532 may include a layer of amorphous silicon (e.g., a Si barrier layer) and a layer titanium oxide (e.g., a TiO2 switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 6 also shows an n+ polysilicon layer 524. As depicted, the npn TFT of vertically oriented select devices 504 can be used to connect the global bit line GBL (layer 526) with any of the vertical bit lines 530.

Moreover, FIG. 6 shows six row select lines ($SG_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region. This allows the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

Figure 8A:
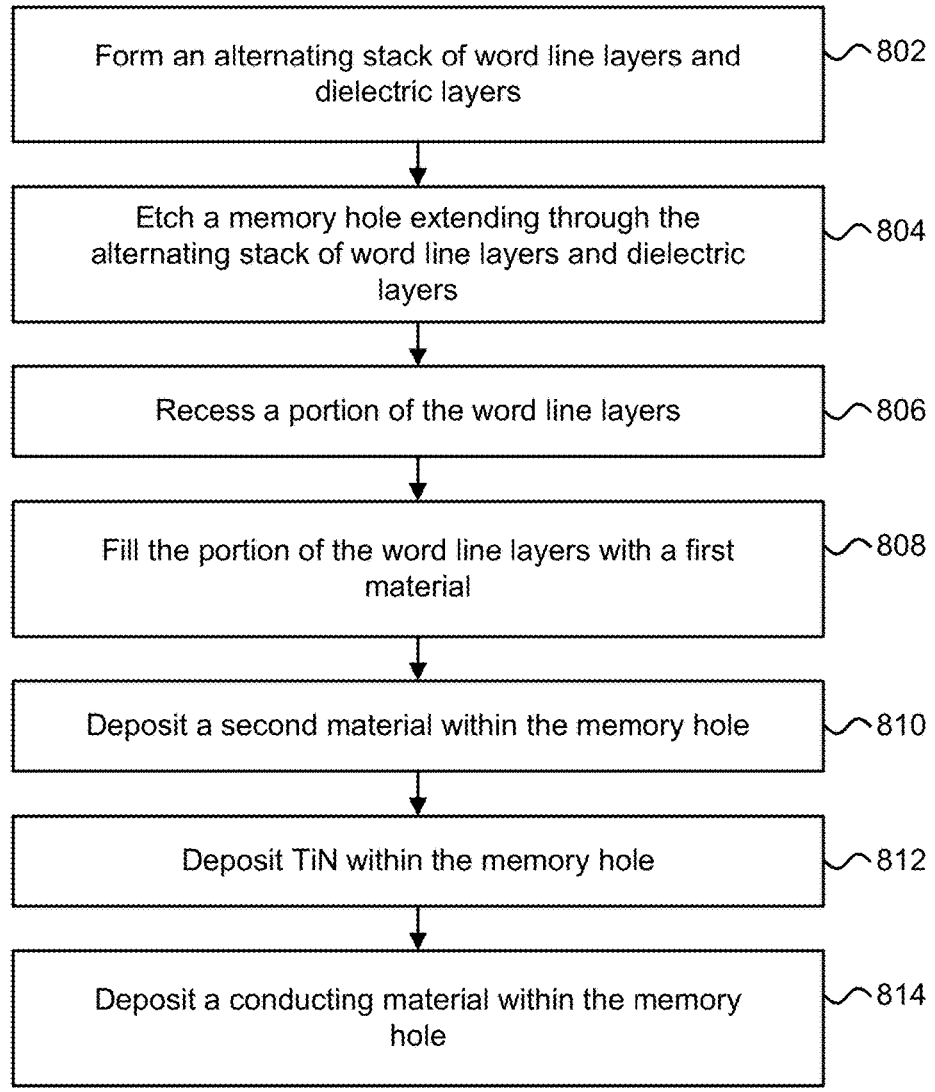
FIGS. 8A-8B depict flowcharts describing embodiments of processes for forming portions of a memory array.
Figure 8B:
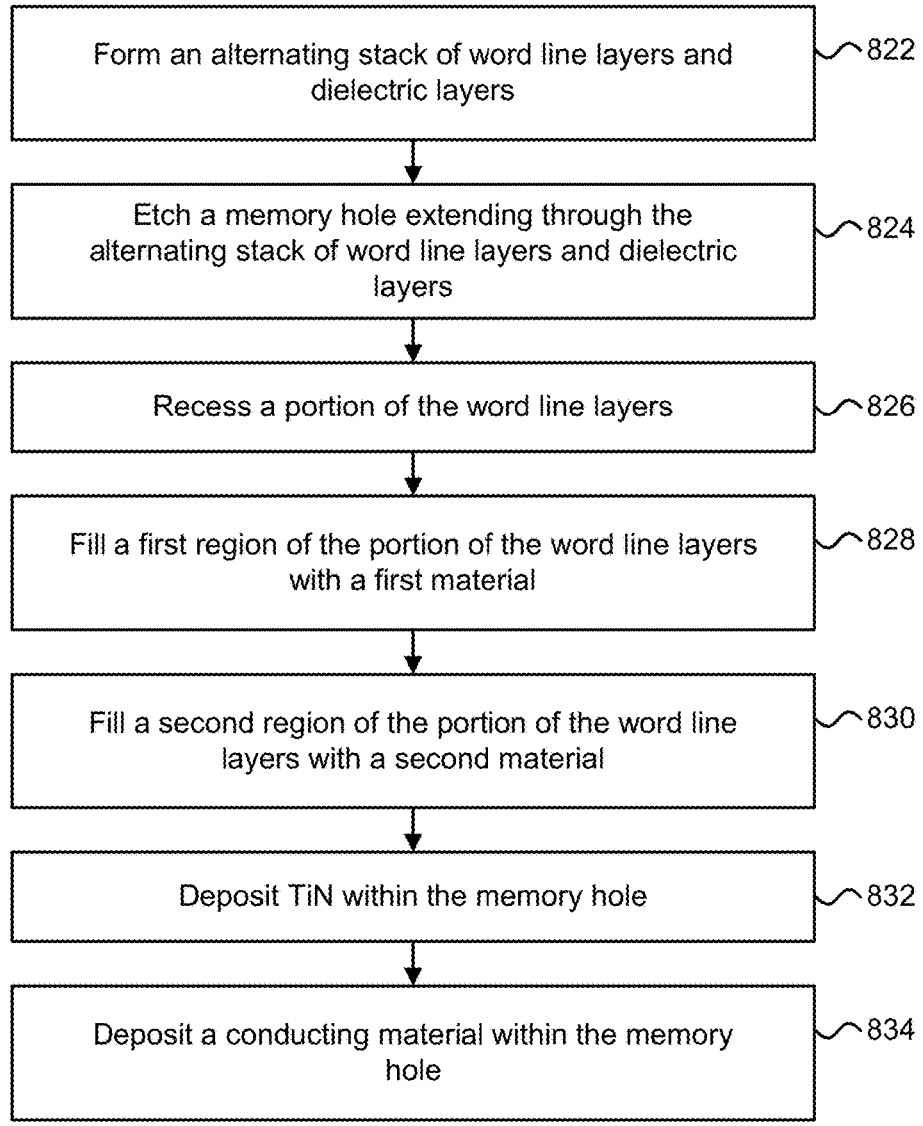

FIGS. 8A-8B depict flowcharts describing embodiments of processes for forming portions of a memory array. The flowcharts may omit common processing steps (e.g., the formation of isolation regions or structures, various implant and annealing steps, the formation of vias/contacts, the formation of a passivation layer, planarization, etc.) in order to highlight the processing steps described.

FIGS. 7A-7L depict various embodiments of processes for forming portions of a memory array. FIGS. 7A-7L may depict various stages of fabrication using cross-sectional views and may be referred to when describing the process of FIGS. 8A-8B.

Referring to FIG. 8A, in step 802, an alternating stack of word line layers and dielectric layers are formed. The alternating stack of word line layers and dielectric layers may comprise an alternating stack of TiN or polysilicon that are separated by layers of oxide or silicon dioxide. The alternating stack of word line layers and dielectric layers may be formed over one or more global bit lines or above a global bit line layer. The layers may be formed over an n+ polysilicon layer, such as n+ polysilicon layer 524 in FIG. 6 or positioned above a substrate, such as a silicon substrate or glass substrate. The alternating stack of word line layers and dielectric layers may be deposited using various deposition techniques such as chemical vapor deposition (CVD), physical vapor deposition (PVD), or atomic layer deposition (ALD). In step 804, a memory hole is etched extending through the alternating stack of word line layers and dielectric layers. The memory hole may be etched using various etching techniques such as dry etching, wet chemical etching, plasma etching, or reactive-ion etching (RIE).

Figure 7A:
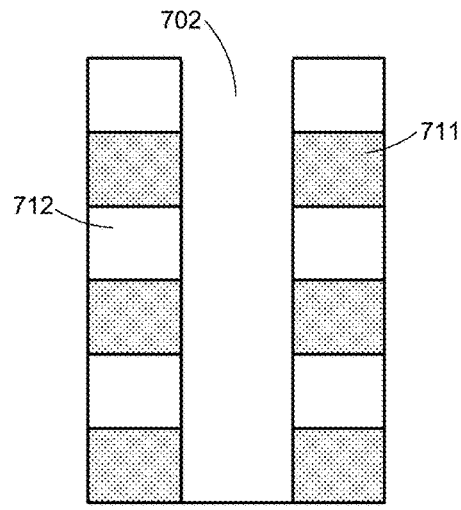
FIGS. 7A-7L depict various embodiments of processes for forming portions of a memory array.

Referring to FIG. 7A, an alternating stack of word line layers and dielectric layers have been formed and a memory hole 702 has been etched extending through the alternating stack of word line layers and dielectric layers. The word line layers include word line layer 712, which may comprise a layer of TiN, polysilicon, titanium, tantalum, or tungsten (W). The dielectric layers include dielectric layer 711, which may comprise a layer of silicon dioxide.

Figure 7B:
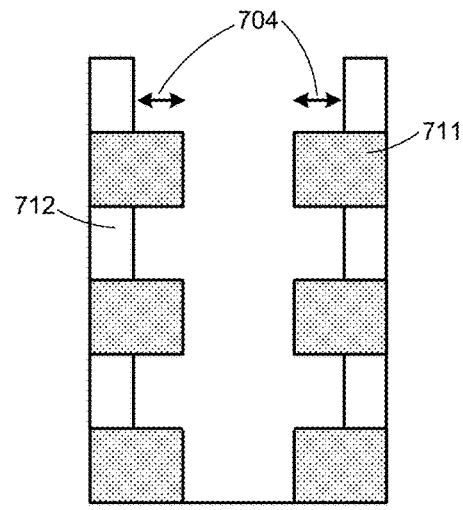
Figure 7C:
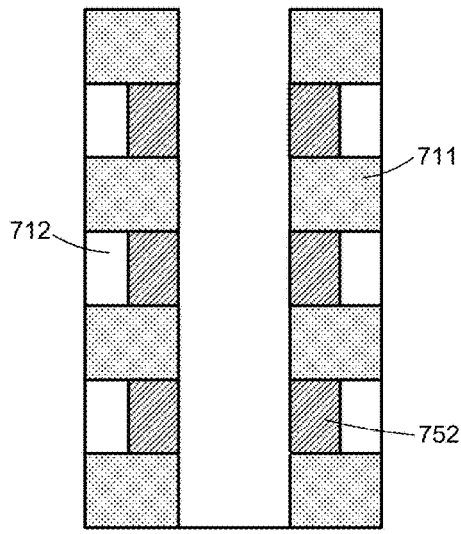
Figure 7D:
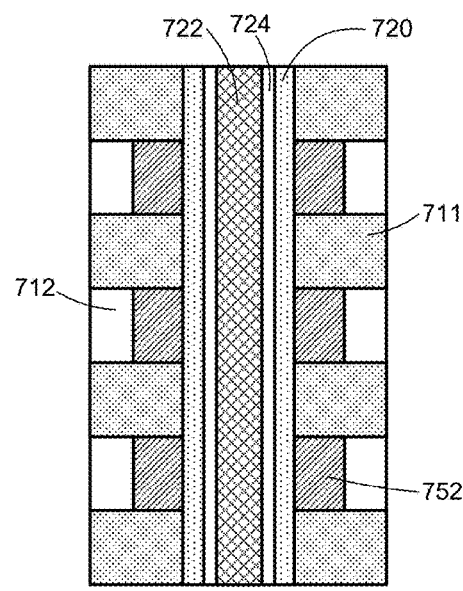
Figure 7E:
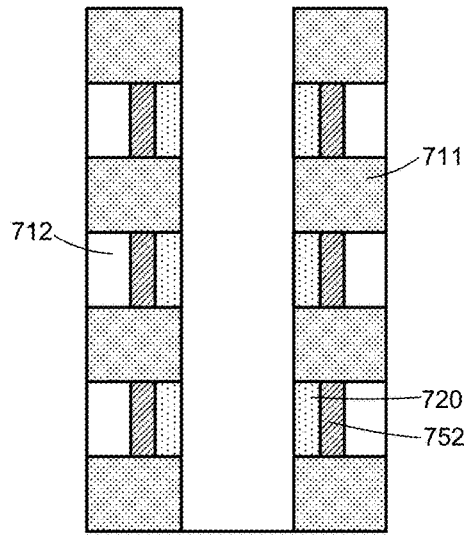
Figure 7F:
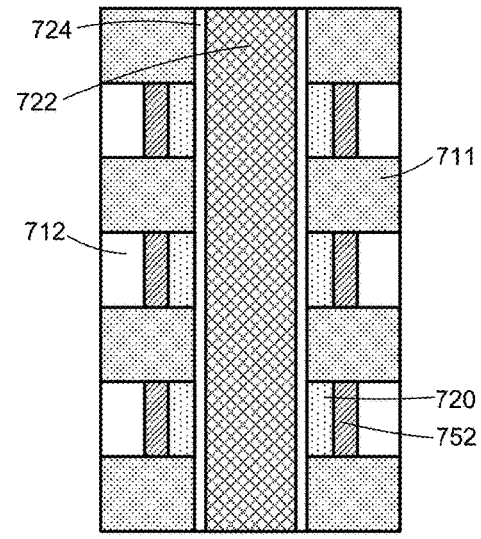
Figure 7G:
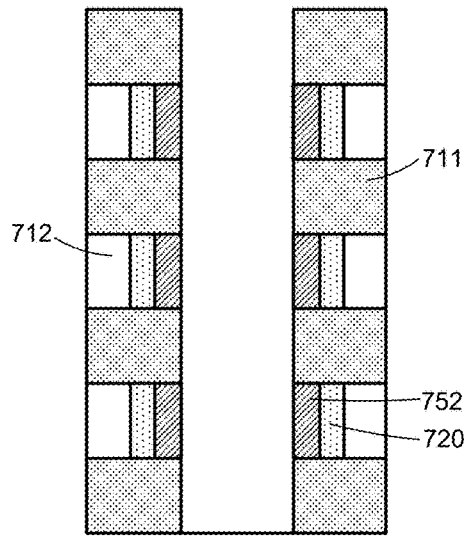
Figure 7H:
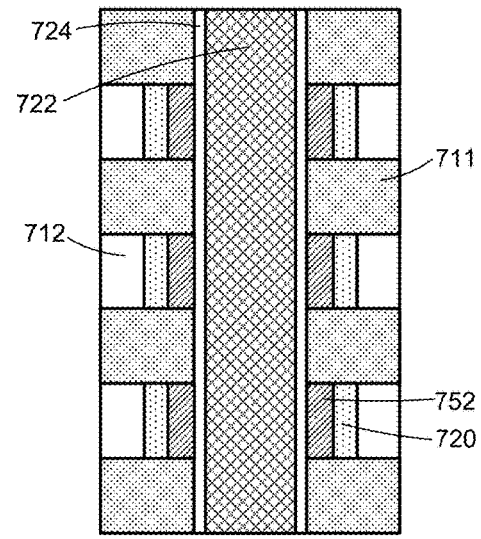

Referring to FIG. 8A, in step 806, a portion of the word line layers is recessed. The word line layers may be recessed using a selective etch or a timed etch. Referring to FIG. 7B, a portion 704 of the word line layers has been recessed or removed. In step 808, the portion of the word line layers that was recessed is filled with a first material. Referring to FIG. 7C, the portion of the word line layers has been filled with a first material 752. In one embodiment, the first material 752 may comprise amorphous silicon. In another embodiment, the first material 752 may comprise titanium oxide. In step 810, a second material is deposited within the memory hole. In step 812, titanium nitride or tungsten nitride may be deposited within the memory hole. In some cases, the layer of titanium nitride or tungsten nitride may be omitted. In step 814, a conducting material (e.g., tungsten) is deposited within the memory hole. Referring to FIG. 7D, a second material 720 has been deposited within the memory hole, along with a layer of titanium nitride 724 and a layer of conducting material 722 (e.g., tungsten). The conducting material 722 within the memory hole may correspond with a vertical bit line.

In one embodiment, the first material 752 may comprise amorphous silicon and the second material 720 may comprise titanium oxide. In another embodiment, the first material 752 may comprise titanium oxide and the second material 720 may comprise amorphous silicon. In some cases, the arrangement of the first material 752 and the second material 720 may be swapped with each other.

Referring to FIG. 8B, in step 822, an alternating stack of word line layers and dielectric layers are formed. The alternating stack of word line layers and dielectric layers may comprise an alternating stack of TiN or polysilicon that are separated by layers of oxide or silicon dioxide. The alternating stack of word line layers and dielectric layers may be formed over one or more global bit lines or above a global bit line layer. The layers may be formed over an n+ polysilicon layer, such as n+ polysilicon layer 524 in FIG. 6 or above a substrate, such as a silicon substrate or glass substrate. The alternating stack of word line layers and dielectric layers may be deposited using various deposition techniques such as chemical vapor deposition (CVD), physical vapor deposition (PVD), or atomic layer deposition (ALD). In step 824, a memory hole is etched extending through the alternating stack of word line layers and dielectric layers. The memory hole may be etched using various etching techniques such as dry etching, wet chemical etching, plasma etching, or reactive-ion etching (RIE).

In step 826, a portion of the word line layers is recessed. The word line layers may be recessed using a selective etch or a timed etch. The etching process may be performed using various etching techniques such as dry etching, wet chemical etching, plasma etching, or reactive-ion etching (RIE). In one embodiment, the etching process may remove the word line material while being highly selective to the dielectric material (i.e., without removing a threshold amount of the dielectric material). In some cases, the etching process may comprise a mixed acid wet etch process.

In step 828, a first region of the portion of the word line layers is filled with the first material. In step 830, a second region of the portion of the word line layers is filled with a second material different from the first material. In one example, the first material may comprise titanium oxide that is deposited using atomic layer deposition. Excess material may be removed using a wet process until the surface is level with the silicon dioxide boundary of the memory hole. Referring to FIGS. 7E, 7G, 7I, and 7K, the portion of the word line layers that was recessed or removed has been filled with a first material 752 and a second material 720. In one embodiment, the first material 752 may comprise amorphous silicon and the second material 720 may comprise titanium oxide. In step 832, titanium nitride (or other material used as a liner) is deposited within the memory hole. In step 834, a conducting material (e.g., tungsten) is deposited within the memory hole. Referring to FIGS. 7F, 7H, 7J, and 7L, a layer of titanium nitride (TiN) 724 and a layer of conducting material 722 have been deposited within the memory hole. The conducting material 722 may comprise n+ polysilicon or tungsten and may correspond with a vertical bit line.

In some embodiments, two or more material layers may be formed within the recessed portion of the word line layers. In other embodiments, the first material 752 may comprise amorphous silicon and the second material 720 may comprise titanium oxide or aluminum oxide. In some cases, a thin layer of aluminum oxide and/or a layer of other high-k dielectrics may be formed between the layer of amorphous silicon and a layer titanium oxide formed within the recessed portion of the word line layers. In some cases, the two or more material layers may be conformally deposited within the recessed portion of the word line layers and excess material may be removed using a wet process such that the two or more material layers do not extend into the memory hole.

Figure 7I:
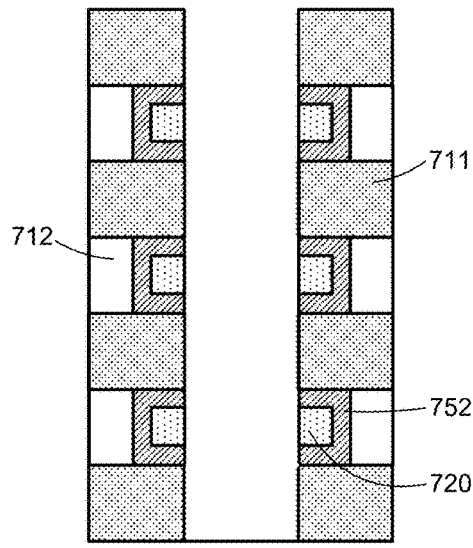
Figure 7J:
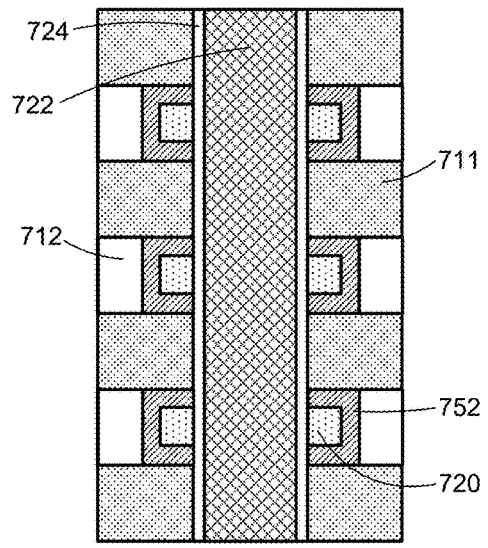
Figure 7K:
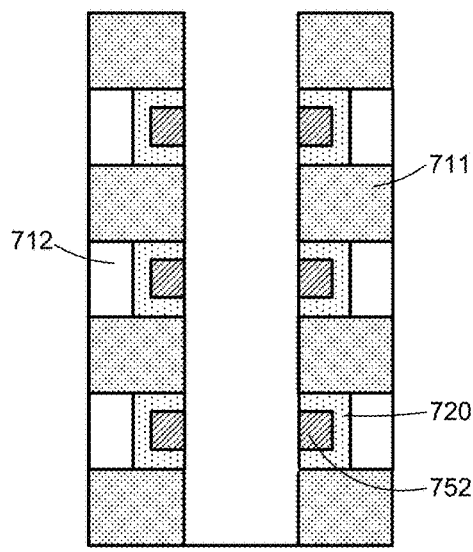
Figure 7L:
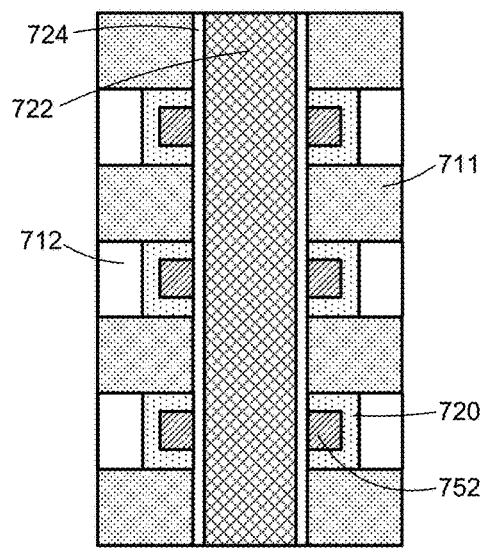

In one embodiment, referring to FIG. 7I, the first material 752 may be conformally deposited within the recessed portion of the word line layer and the second material 720 may be formed over or deposited on the first material 752 to form the structure depicted in FIG. 7I. In some cases, the first material 752 may partially surround the second material 720 such that the second material 720 is not in direct contact with any dielectric layers. In another embodiment, referring to FIG. 7K, the second material 720 may be conformally deposited within the recessed portion of the word line layer and the first material 752 may be formed over or deposited on the second material 720 to form the structure depicted in FIG. 7K. In some cases, the second material 720 may partially surround the first material 752 such that the first material 752 is not in direct contact with any dielectric layers.

In one embodiment, a layer of titanium oxide may be partially embedded within a recessed region of a word line layer while a layer of amorphous silicon is formed within a memory hole and is not formed within the recessed region of the word line layer. In this case, the word line layers within the alternating stack of word line layers and dielectric layers may be formed using titanium metal. A thin layer of titanium nitride may be used on the top and/or bottom of each layer of titanium metal in order to prevent excess oxidation of titanium by dielectric layers comprising silicon dioxide. In another embodiment, a layer of titanium oxide and a layer of amorphous silicon may be fully embedded within a recessed region of the word line layer. In this case, both the layer of titanium oxide and the layer of amorphous silicon may be totally formed within the recessed region and may not extend outside of the recessed region. In some cases, the word line layers may comprise titanium metal and the word line layers may be recessed with a mixed acid wet etch process.

In some cases, a word line layer may comprise a particular metal (e.g., titanium, tantalum, or tungsten) and a portion of the VMCO structure or the memory cell structure may be formed via oxidation of the word line layer (e.g., after etching of a memory hole or after recessing a portion of the word line layer). The portion of the VMCO structure or the memory cell structure may comprise a metal oxide. In one example, the word line layer may comprise titanium and the portion of the memory cell structure may comprise titanium oxide. In another example, the word line layer may comprise tungsten and the portion of the memory cell structure may comprise tungsten oxide. In another example, the word line layer may comprise tantalum and the portion of the memory cell structure may comprise tantalum oxide.

One embodiment of the disclosed technology includes forming an alternating stack of word line layers and dielectric layers, etching a memory hole extending through the alternating stack of word line layers and dielectric layers, recessing a portion of a first word line layer of the word line layers subsequent to etching the memory hole, depositing a layer of amorphous silicon within a first region of the recessed portion of the first word line layer, depositing a layer of titanium oxide within a second region of the recessed portion of the first word line layer, and filling at least a portion of the memory hole with a conducting material subsequent to depositing the layer of amorphous silicon and the layer of titanium oxide.

One embodiment of the disclosed technology includes depositing a word line material above a dielectric material, etching a memory hole extending through the word line material and the dielectric material, recessing a portion of the word line material without removing a threshold amount of the dielectric material subsequent to etching the memory hole, depositing a layer of amorphous silicon within a first region of the recessed portion of the word line material, depositing a layer of titanium oxide within a second region of the recessed portion of the word line material, and filling at least a portion of the memory hole with a conducting material, the layer of amorphous silicon and the layer of titanium oxide do not extend into the memory hole.

One embodiment of the disclosed technology includes a vertical bit line arranged orthogonal to a substrate, a first memory cell arranged between a first word line and the vertical bit line, and a second memory cell arranged between a second word line and the vertical bit line. The first memory cell includes a first portion of a layer of amorphous silicon and a first portion of a layer of titanium oxide. The second word line is arranged above the first word line. The second memory cell includes a second portion of the layer of amorphous silicon and a second portion of the layer of titanium oxide. The first portion of the layer of amorphous silicon does not directly contact or abut the second portion of the layer of amorphous silicon. The first portion of the layer of titanium oxide does not directly contact or abut the second portion of the layer of titanium oxide. The first portion of the layer of amorphous silicon and the second portion of the layer of amorphous silicon were formed during the same deposition step in which the layer of amorphous silicon was deposited within recessed regions of the first word line and the second word line. The first portion of the layer of titanium oxide and the second portion of the layer of titanium oxide were formed during the same deposition step in which the layer of titanium oxide was deposited within recessed regions of the first word line and the second word line.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A memory structure, comprising:
   a vertical bit line arranged orthogonal to a substrate;
   a second word line layer;
   a first dielectric layer;
   a first word line layer, the second word line layer arranged above the first dielectric layer, the first dielectric layer arranged above the first word line layer;
   a first memory cell connected to the vertical bit line, the first memory cell arranged within a recessed portion of the first word line layer arranged below the first dielectric layer, the first memory cell includes a first layer of amorphous silicon and a first layer of titanium oxide; and
   a second memory cell connected to the vertical bit line, the second memory cell arranged within a recessed portion of the second word line layer arranged above the first dielectric layer, the second memory cell includes a second layer of amorphous silicon and a second layer of titanium oxide, the recessed portion of the second word line layer is arranged above the recessed portion of the first word line layer.

2. The memory structure of claim 1, wherein:
   the first layer of amorphous silicon is arranged between the first layer of titanium oxide and the first dielectric layer.

3. The memory structure of claim 1, wherein:
the first layer of titanium oxide is arranged between the first layer of amorphous silicon and the first dielectric layer.

4. The memory structure of claim 1, wherein:
the first layer of amorphous silicon is arranged between the first layer of titanium oxide and the vertical bit line.

5. The memory structure of claim 1, wherein:
the first layer of titanium oxide is arranged between the first layer of amorphous silicon and the vertical bit line.

6. The memory structure of claim 1, wherein:
the recessed portion of the second word line layer is completely filled by the second layer of amorphous silicon and the second layer of titanium oxide.

7. The memory structure of claim 1, wherein:
the first word line layer comprises a word line material; and
the first dielectric layer comprises a dielectric material.

8. The memory structure of claim 7, wherein:
the word line material comprises titanium nitride; and
the dielectric material comprises silicon dioxide.

9. The memory structure of claim 1, wherein:
the recessed portion of the first word line layer is completely filled by the first layer of amorphous silicon and the first layer of titanium oxide.

10. A memory structure, comprising:
a vertical bit line arranged orthogonal to a substrate;
a first memory cell arranged between a first word line and the vertical bit line, the first memory cell includes a first portion of a layer of amorphous silicon and a first portion of a layer of titanium oxide, the first memory cell is arranged within a recessed portion of a first word line layer corresponding with the first word line; and
a second memory cell arranged between a second word line and the vertical bit line, the second word line is arranged above the first word line, the second memory cell includes a second portion of the layer of amorphous silicon and a second portion of the layer of titanium oxide, the first portion of the layer of amorphous silicon does not directly contact the second portion of the layer of amorphous silicon, the first portion of the layer of titanium oxide does not directly contact the second portion of the layer of titanium oxide, the second memory cell is arranged within a recessed portion of the second word line layer corresponding with the second word line, the recessed portion of the second word line layer is arranged above the recessed portion of the first word line layer.

11. The memory structure of claim 10, wherein:
the first portion of the layer of amorphous silicon is arranged between the first portion of the layer of titanium oxide and the vertical bit line.

12. The memory structure of claim 10, wherein:
the first portion of the layer of titanium oxide is arranged between the first portion of the layer of amorphous silicon and the vertical bit line.

13. The memory structure of claim 10, wherein:
the vertical bit line comprises tungsten; and
the first word line comprises titanium nitride.

14. The memory structure of claim 10, wherein:
the recessed portion of the first word line layer includes the first portion of the layer of amorphous silicon and the first portion of the layer of titanium oxide.

15. The memory structure of claim 10, wherein:
the recessed portion of the second word line layer includes the second portion of the layer of amorphous silicon and the second portion of the layer of titanium oxide.

16. A memory structure, comprising:
a vertical bit line arranged orthogonal to a substrate;
a first word line layer arranged below a second word line layer
a first memory cell connected to the vertical bit line, the first memory cell arranged within a recessed portion of the first word line layer, the first memory cell includes a first layer of amorphous silicon and a first layer of titanium oxide; and
a second memory cell connected to the vertical bit line, the second memory cell arranged within a recessed portion of the second word line layer, the second memory cell includes a second layer of amorphous silicon and a second layer of titanium oxide, the recessed portion of the second word line layer is arranged above the recessed portion of the first word line layer.

17. The memory structure of claim 16, wherein:
the first layer of amorphous silicon is arranged between the first layer of titanium oxide and the vertical bit line.

18. The memory structure of claim 16, wherein:
the first layer of titanium oxide is arranged between the first layer of amorphous silicon and the vertical bit line.

* * * * *